United States Patent
Kettler

(10) Patent No.: US 9,160,142 B2
(45) Date of Patent: Oct. 13, 2015

(54) LASER

(71) Applicant: PBC Lasers GmbH, Berlin (DE)

(72) Inventor: Thorsten Kettler, Berlin (DE)

(73) Assignee: PBC LASERS GMBH, Berlin (DE)

( * ) Notice: Subject to any disclaimer, the term of this patent is extended or adjusted under 35 U.S.C. 154(b) by 0 days.

(21) Appl. No.: 14/304,237

(22) Filed: Jun. 13, 2014

(65) Prior Publication Data

US 2014/0369371 A1 Dec. 18, 2014

(30) Foreign Application Priority Data

Jun. 18, 2013 (EP) .................................... 13172422
Apr. 15, 2014 (EP) .................................... 14164759

(51) Int. Cl.
*H01S 5/00* (2006.01)
*H01S 5/22* (2006.01)
(Continued)

(52) U.S. Cl.
CPC . *H01S 5/22* (2013.01); *H01S 5/101* (2013.01); *H01S 5/4031* (2013.01); *H01S 5/14* (2013.01); *H01S 5/142* (2013.01); *H01S 5/4062* (2013.01); *H01S 5/4068* (2013.01); *H01S 5/4081* (2013.01)

(58) Field of Classification Search
CPC ........... H01S 5/101; H01S 5/14; H01S 5/142; H01S 5/22; H01S 5/4031; H01S 5/4062; H01S 5/4068; H01S 5/4081
USPC ...................................................... 372/45.01
See application file for complete search history.

(56) References Cited

U.S. PATENT DOCUMENTS

RE31,806 E * 1/1985 Scifres et al. ............ 372/50.121
4,875,216 A * 10/1989 Thornton et al. .......... 372/45.01
(Continued)

FOREIGN PATENT DOCUMENTS

| EP | 1 677 396 | 7/2006 |
|----|-----------|--------|
| JP | H-037006188 A | 4/1991 |
| WO | WO-01/33268 A1 | 5/2001 |
| WO | WO-02/21651 A1 | 3/2002 |
| WO | WO-2005/124953 A1 | 12/2005 |
| WO | WO-2008/140718 | 11/2008 |

OTHER PUBLICATIONS

Elarde et al: "Curved Waveguide Array Diode Lasers for High-Brightness Applications", IEEE Photonics Technology Letters, vol. 20, No. 13, ISSN: 1041-1135, pp. 1085-1087, dated Jul. 7, 2008.

(Continued)

*Primary Examiner* — Tod T Van Roy
*Assistant Examiner* — Vu A Vu
(74) *Attorney, Agent, or Firm* — Foley & Lardner LLP

(57) ABSTRACT

The invention relates to a laser (1) with a laser chip (10) having a plurality of active laser channels (20), a front facet (10a) for coupling out the laser radiation of the laser channels (20) and a rear facet (10b) for rear—side reflection of the laser radiation of the laser channels (20) in the direction of the front facet (10a); an external resonator (50) which couples a portion of the radiation exiting the laser chip (10) at the front facet (10a) back into the laser chip (10) and, by said back-coupling, couples the radiation of the laser channels (20) with one another; wherein at least one of the laser channels (20) is curved at least sectionally and—in the far field—in addition to a main beam (P3), at least one secondary beam (P1, P2) is divergently emitted by the laser chip (10); and wherein the resonator (50) reflects at least one of the secondary beams (P1, P2), which is—in the far field—divergently emitted by the laser chip (10) next to a main beam (P3), in the direction of the laser chip (10).

8 Claims, 18 Drawing Sheets

Figure 1:
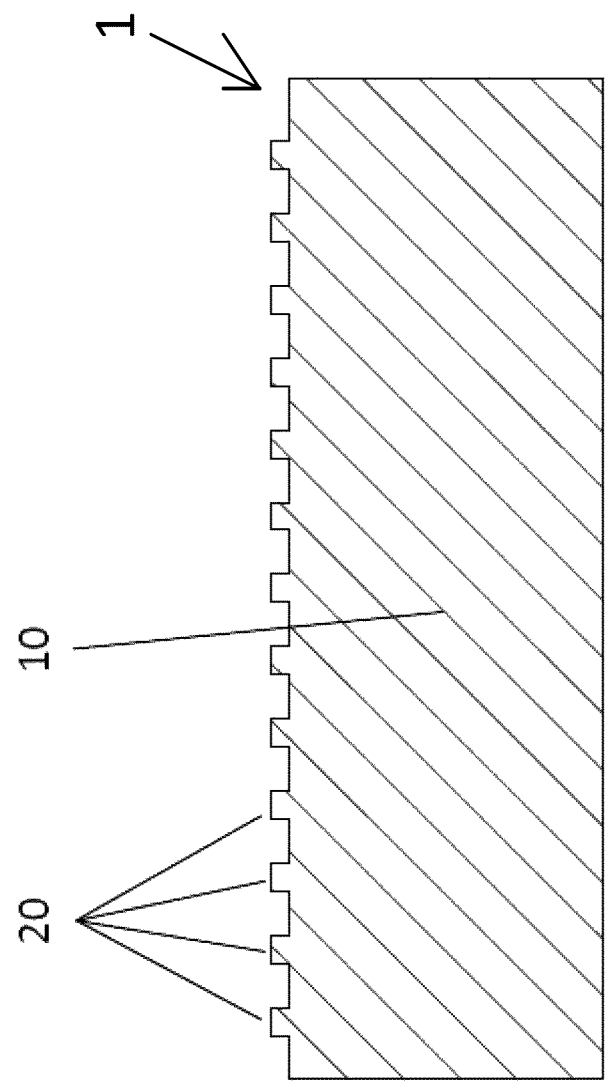

(51) Int. Cl.
*H01S 5/10* (2006.01)
*H01S 5/40* (2006.01)
*H01S 5/14* (2006.01)

(56) References Cited

U.S. PATENT DOCUMENTS

| | | | |
|---|---|---|---|
| 4,977,570 | A | 12/1990 | Hasegawa |
| 5,337,328 | A * | 8/1994 | Lang et al. ............... 372/45.01 |
| 6,538,817 | B1 * | 3/2003 | Farmer et al. ............... 359/618 |
| 8,107,508 | B2 | 1/2012 | Oh et al. |
| 2008/0273564 | A1 * | 11/2008 | Wang et al. ............. 372/45.011 |
| 2011/0310916 | A1 | 12/2011 | Kimoto et al. |
| 2012/0147912 | A1 * | 6/2012 | Moench et al. ............ 372/29.02 |
| 2014/0086539 | A1 * | 3/2014 | Goutain et al. ................ 385/89 |

OTHER PUBLICATIONS

Hillmer et al., "Continuously Chirped DFB Gratings by Specially Bent Waveguides for Tunable Lasers", Journal of Lightwave Technology, vol. 13, No. 9, ISSN: 0733-8724, pp. 1905-1912, dated Sep. 1995.

Tang X et al.; Mode Locking of Individual Array of a Gain-Guided Single-Quantum-Well Laser Array With an External Mirror, IEEE Journal of Quantum Electronics, IEEE Service Center, Piscataway, NJ, USA, vol. 33, No. 5, May 5, 1997, pp. 784-789.

European Search Report; issued Aug. 11, 2014; 9 pages.

* cited by examiner

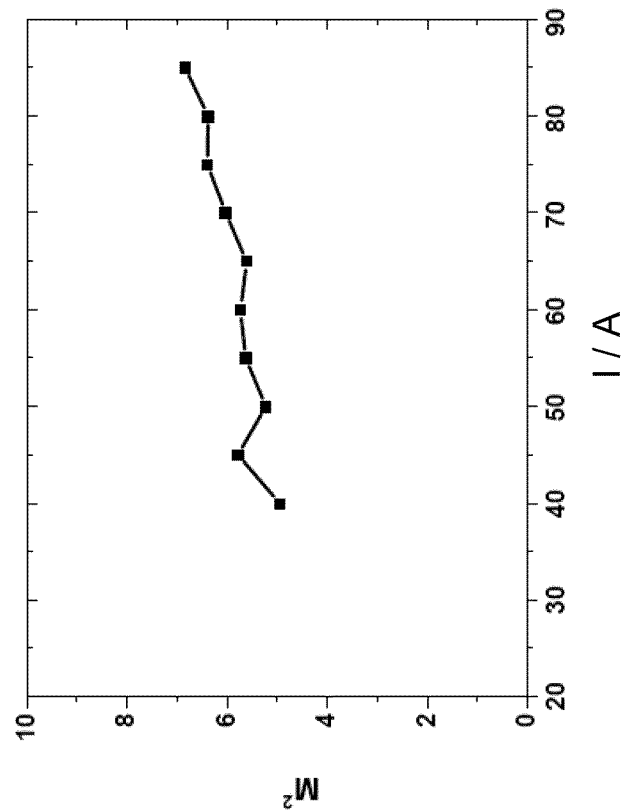
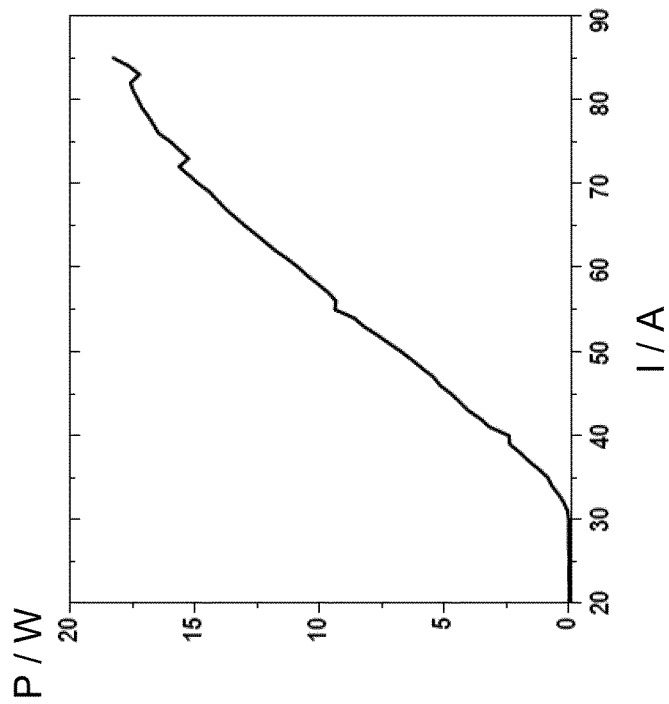
Fig. 18

LASER

The invention relates to a laser with a laser chip having a plurality of active laser channels, a front facet for coupling out the laser radiation of the laser channels and a rear facet for rear-side reflection of the laser radiation of the laser channels in the direction of the front facet.

Semiconductor lasers having a very high optical output power are frequently used for material processing. In order to achieve a high optical power in the range of a few 10 W up to kW, it is known to use for example broad area lasers. Said lasers which are already known emit a wide, multimode beam. Said beam has a comparatively poor beam quality, as a result of which the optical energy of the laser chip can be focused only poorly. In said laser chips, the achievable power density in a focal point is therefore limited.

It is furthermore known to use laser chips which have many individual active laser channels on one chip. If said laser channels are arranged very closely next to one another, the radiation from the neighboring channels can optically couple with one another by way of interference and a few specific optical modes may form which could result in a narrowing of the emitted beam. This is advantageous since the optical energy can be concentrated well onto a smaller space.

The invention is based on the object of specifying a laser having a plurality of active laser channels, which has better emission characteristics than previously known lasers of such construction.

This object is achieved according to a first embodiment variant according to the invention by a laser having the features according to patent claim 1. Advantageous embodiments of the laser according to the invention are stated in the dependent claims.

Accordingly, provision is made as per the first embodiment variant according to the invention for a laser with a laser chip having a plurality of active laser channels, a front facet for coupling out the laser radiation of the laser channels and a rear facet for rear-side reflection of the laser radiation of the laser channels in the direction of the front facet; an external resonator which couples a portion of the radiation exiting the laser chip at the front facet back into the laser chip and, by said back-coupling, couples the radiation of the laser channels with one another; wherein at least one of the laser channels is curved at least sectionally and—in the far field—in addition to a main beam, at least one secondary beam is divergently emitted by the laser chip; and wherein the resonator reflects at least one of the secondary beams, which is—in the far field—divergently emitted by the laser chip next to a main beam, in the direction of the laser chip.

One significant advantage of the laser according to the invention is that by providing laser channels which are curved sectionally and the described back-coupling of at least one secondary beam by the resonator, the coupling-out behavior at the front facet of the laser chip and/or the coupling behavior between the radiation of the individual laser channels can be optimized individually depending on the use of the laser.

A secondary beam herein is understood to mean a beam which has less radiation power than the main beam of the output radiation; the main beam accordingly has the largest radiation power of the emitted beams.

It is considered advantageous if the curvature of the laser channels is configured such that—without the back-coupling of the external resonator—no fixed phase relationship between neighboring laser channels occurs and no mode is preferred owing to chip-internal coupling of the laser channels, and the mode present in the laser chip is determined by the back-coupling of the external resonator.

The resonator is preferably configured such that it optically couples the radiation of the laser channels such that an in-phase mode is present in the laser chip which has—in the far field—the main beam and the divergently emitted secondary beams.

It is particularly advantageous if, both owing to the curvature of the laser channel or channels and owing to the coupling of the laser channels by the resonator, an in-phase mode is formed with—in the far field—a main beam and two secondary beams, divergently emitted next to the main beam.

The two secondary beams are in the in-phase mode preferably located on different sides of the main beam immediately adjacent next to the main beam.

The main beam is preferably coupled out of the laser.

As regards the resonator, it is considered advantageous if owing to one or a plurality of resonator mirrors of the resonator, at least one of the secondary beams divergently emitted next to the main beam, preferably two secondary beams, divergently emitted directly adjacent next to the main beam, are reflected in the direction of the laser chip and the main beam passes through the resonator mirror or mirrors without reflection.

The laser channels preferably have curvatures which deviate from one another.

Owing to the curvature of the laser channel or channels and the back-coupling of the resonator, the coupling of the laser channels is preferably set such that the phase position of the radiation exiting at the front facet of the individual laser channels among one another is less than 45°, preferably nearly or equal to zero.

According to another advantageous embodiment, provision is made for the laser channels to at least also be coupled by chip-internal coupling. In such an embodiment it is advantageous if, owing to the chip-internal coupling of the laser channels in the laser chip, at least also an in-phase mode is present, which has—in the far field—the main beam and the divergently emitted secondary beams, and the mode present in the laser chip is supported by the external resonator.

It is also advantageous if in each case the angles of the laser channels at the front facet and the rear facet on the laser chip are different owing to the curvature of the laser channels, and the angle of at least some of the laser channels, preferably all laser channels, with respect to the front facet differs from 90°.

The angle on the laser chip of at least some of the laser channels, preferably all laser channels, with respect to the rear facet is preferably equal to 90°, and the rear facet is preferably provided with a reflective coating.

The front facet of the laser chip is preferably provided with a reflection-reducing coating.

Partial regions of the laser channels are preferably curved and partial regions of the laser channels are preferably linear.

The object of the invention specified in the introductory part, namely to specify a laser having a plurality of active laser channels, which has better emission characteristics than previously known lasers of said construction, is also achieved by a second embodiment variant according to the invention. The second embodiment variant according to the invention comprises a laser with a laser chip, having a plurality of active laser channels, a front facet for coupling out the laser radiation of the laser channels and a rear facet for rear-side reflection of the laser radiation of the laser channels in the direction of the front facet, wherein at least one of the laser channels is curved at least sectionally.

One significant advantage of the second embodiment variant according to the invention is that, owing to the provision of laser channels which are curved sectionally, the coupling-out behavior at the front facet of the laser chip and/or the coupling behavior between the radiation of the individual laser channels can be optimized individually depending on the use of the laser.

The advantageous embodiment forms mentioned below apply both to the first and to the second embodiment variant according to the invention.

With view to the generation of laser beams with particularly high output power with good beam quality, it is considered advantageous if the laser channels are coupled together optically at least in partial sections of the laser chip.

It is considered to be particularly advantageous if the coupling of the laser channels is changed owing to the curvature of the laser channel or channels—compared to only linear laser channels—and the lateral far fields of the beam modes exiting at the front facet are modified.

Owing to the curvature of the laser channel or channels, the coupling of the laser channels is preferably set such that the phase position of the radiation of the individual laser channels exiting at the front facet among one another is less than 45°, preferably nearly or equal to zero.

According to a particularly preferred embodiment of the laser, provision is made for an in-phase mode with—in the far field—a main beam and two secondary beams divergently emitted next to the main beam being formed owing to the curvature of the laser channel or channels and the coupling of the laser channels in the curved section or sections.

The laser preferably has an external resonator, which couples a portion of the radiation exiting the laser chip at the front facet back into the laser chip.

A particularly advantageous embodiment of the laser makes provision for the external resonator to reflect one of the secondary beams or both secondary beams of the in-phase mode entirely or partially toward the front facet of the laser chip, for the main beam to pass the resonator and to exit the laser as an output beam, and for the in-phase mode to oscillate in the laser chip owing to the back-coupling of the secondary beam or beams.

In each case the angles of the laser channels at the front facet and the rear facet are preferably different owing to the curvature of the laser channels.

With view to a back-reflection which is as low as possible at the front facet of the laser chip, it is considered to be advantageous if the angle of at least some of the laser channels, preferably all laser channels, with respect to the front facet differs from 90°.

It is advantageous if the angle of at least some of the laser channels, preferably all laser channels, with respect to the rear facet is equal to 90°, and the rear facet is provided with a reflective coating.

The form of the modes exiting the laser chip can be varied, for example, if the laser channels have curvatures which deviate from one another.

Provision may alternatively be made for the laser channels to have identical curvatures and to extend equidistantly.

Provision may also be made for partial regions of the laser channels to be curved and for partial regions of the laser channels to be linear.

As already mentioned, coupling of the laser channels is advantageous depending on the field of use. In order to achieve coupling, the laser channels are preferably optically coupled entirely or at least in partial sections of the laser chip.

Alternatively or additionally, the radiation can be coupled outside the laser chip, for example using an external resonator which couples the radiation of the laser channels with one another.

Figure 2:
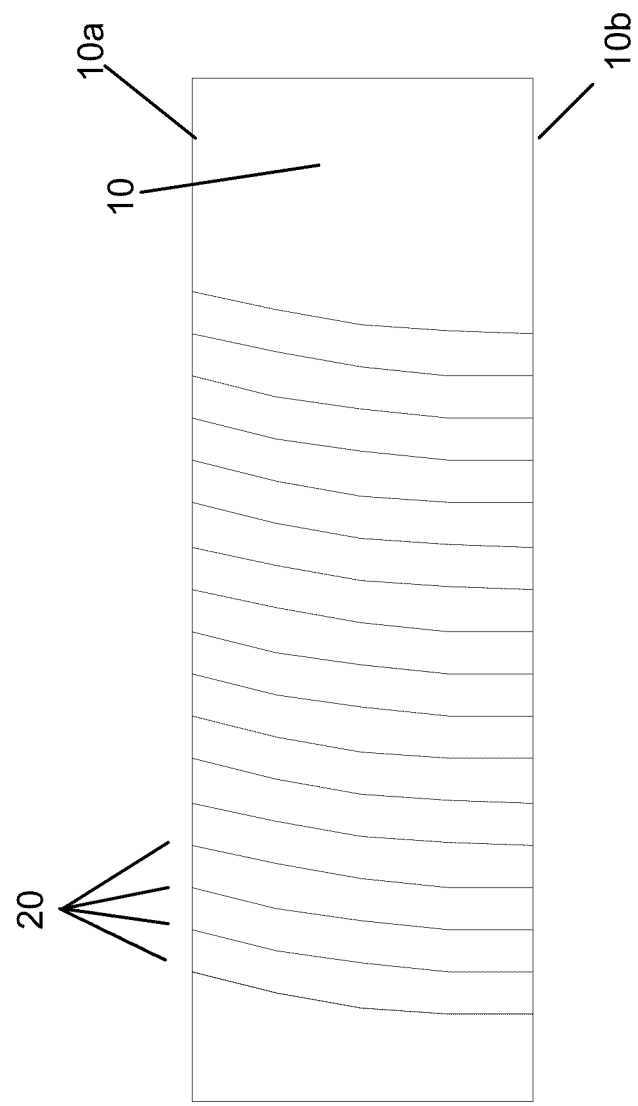
Figure 3:
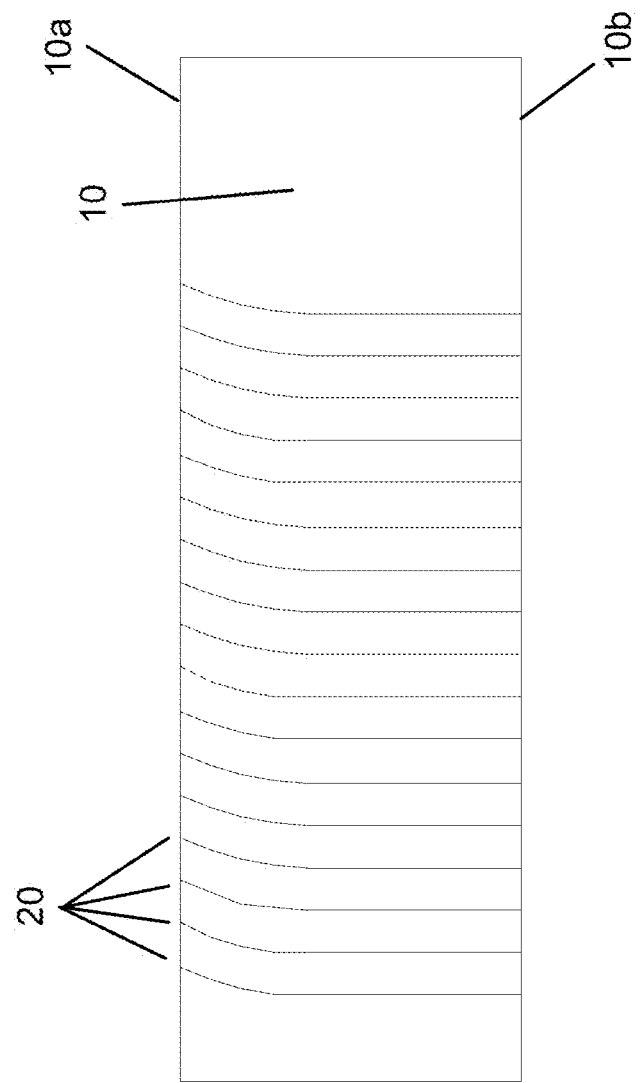
Figure 4:
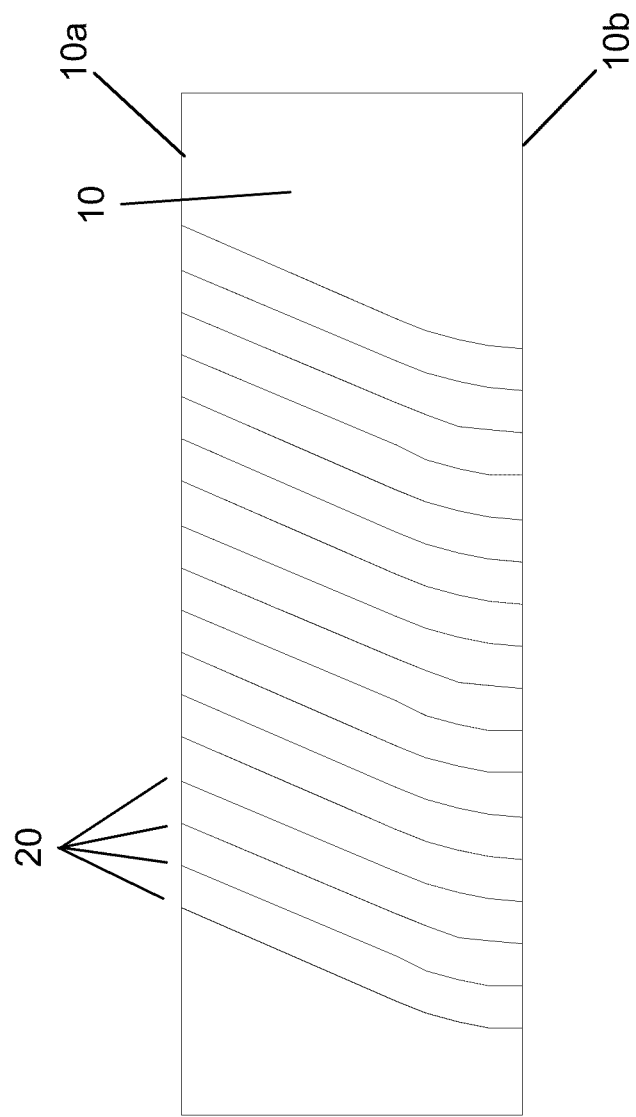
Figure 5:
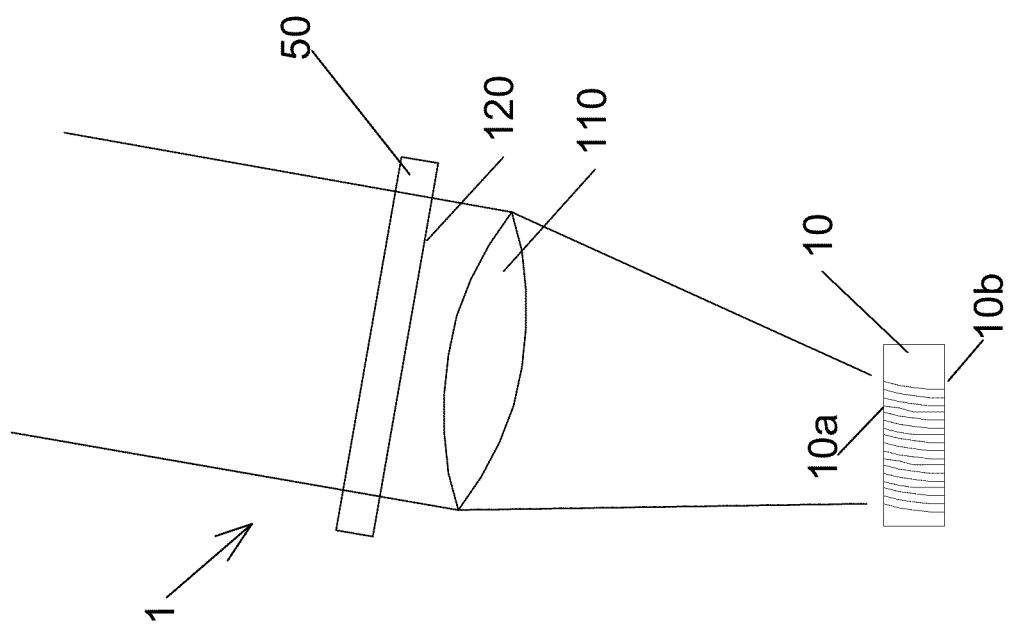
Figure 6:
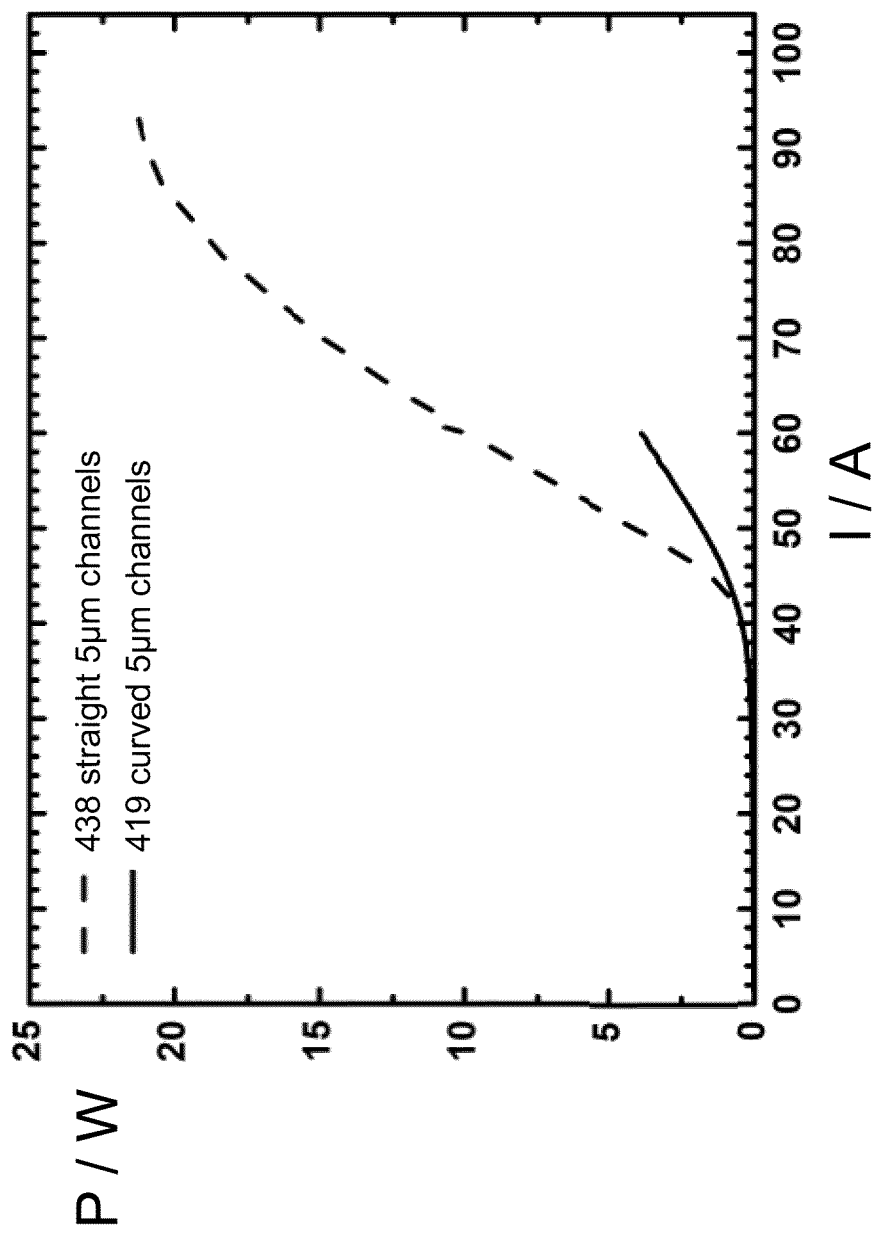
Figure 7:
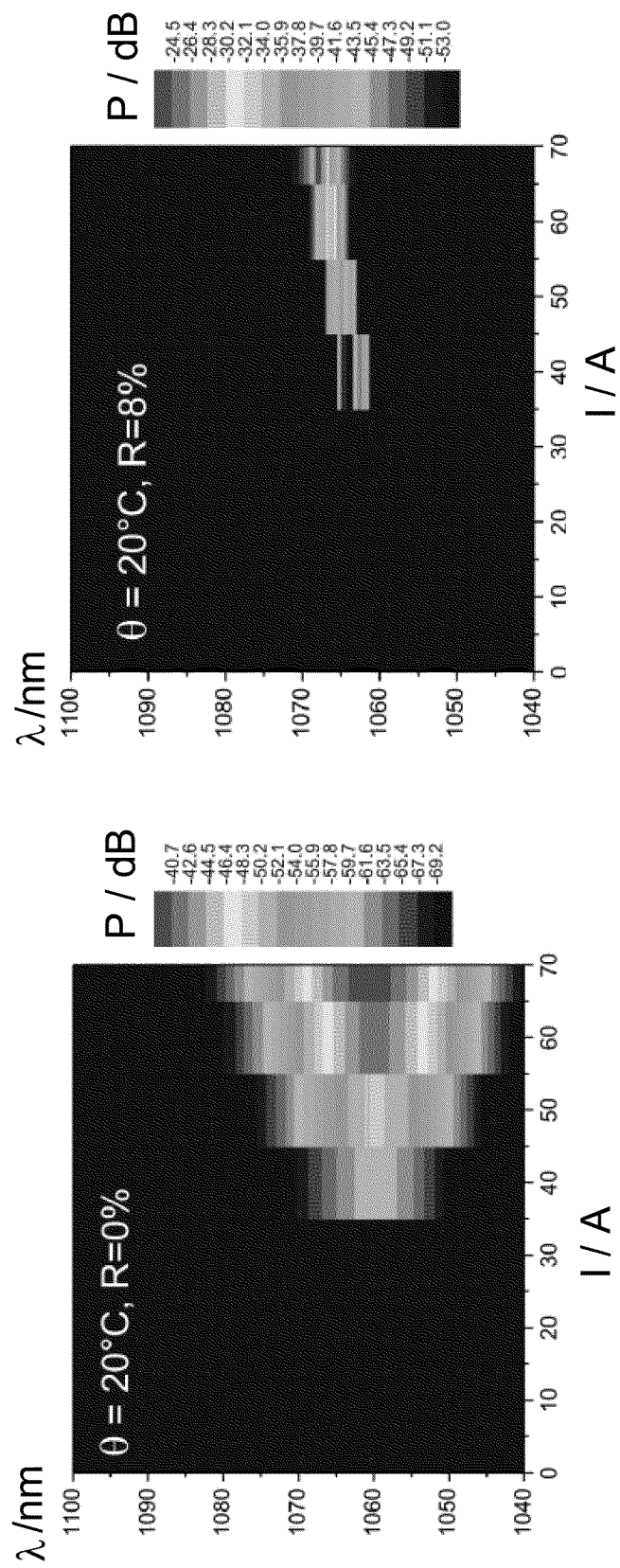
Figure 8:
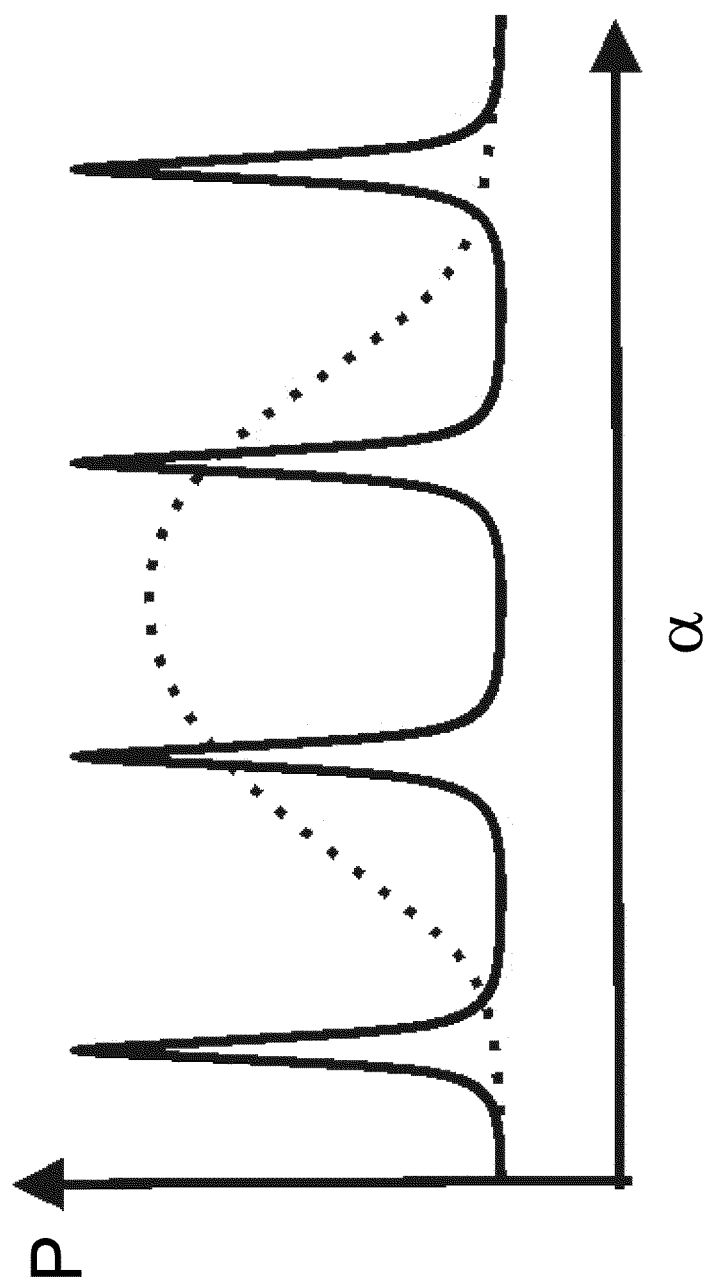
Figure 9:
Figure 10:
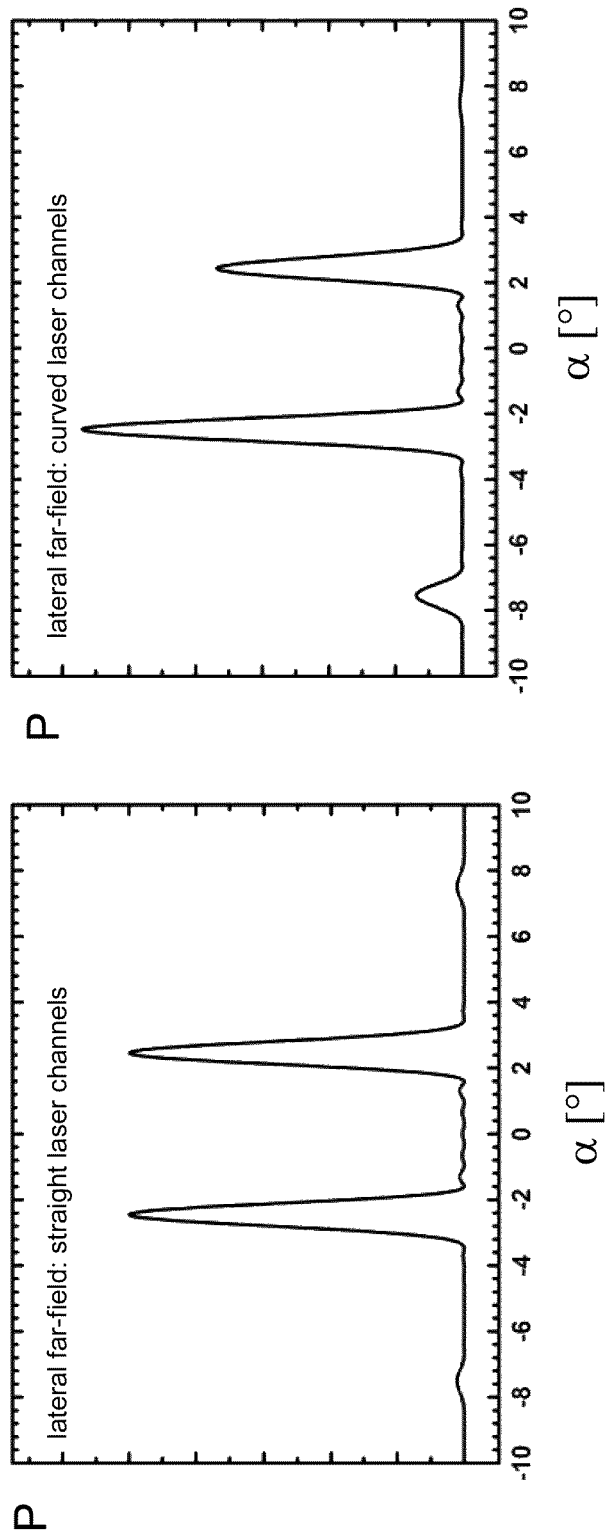
Figure 11:
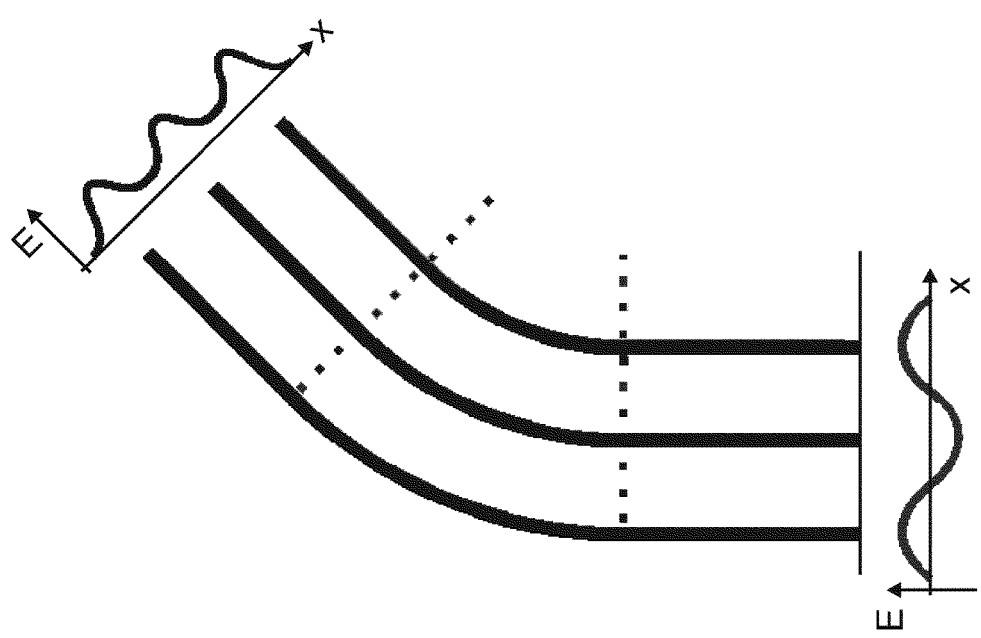
Figure 12:
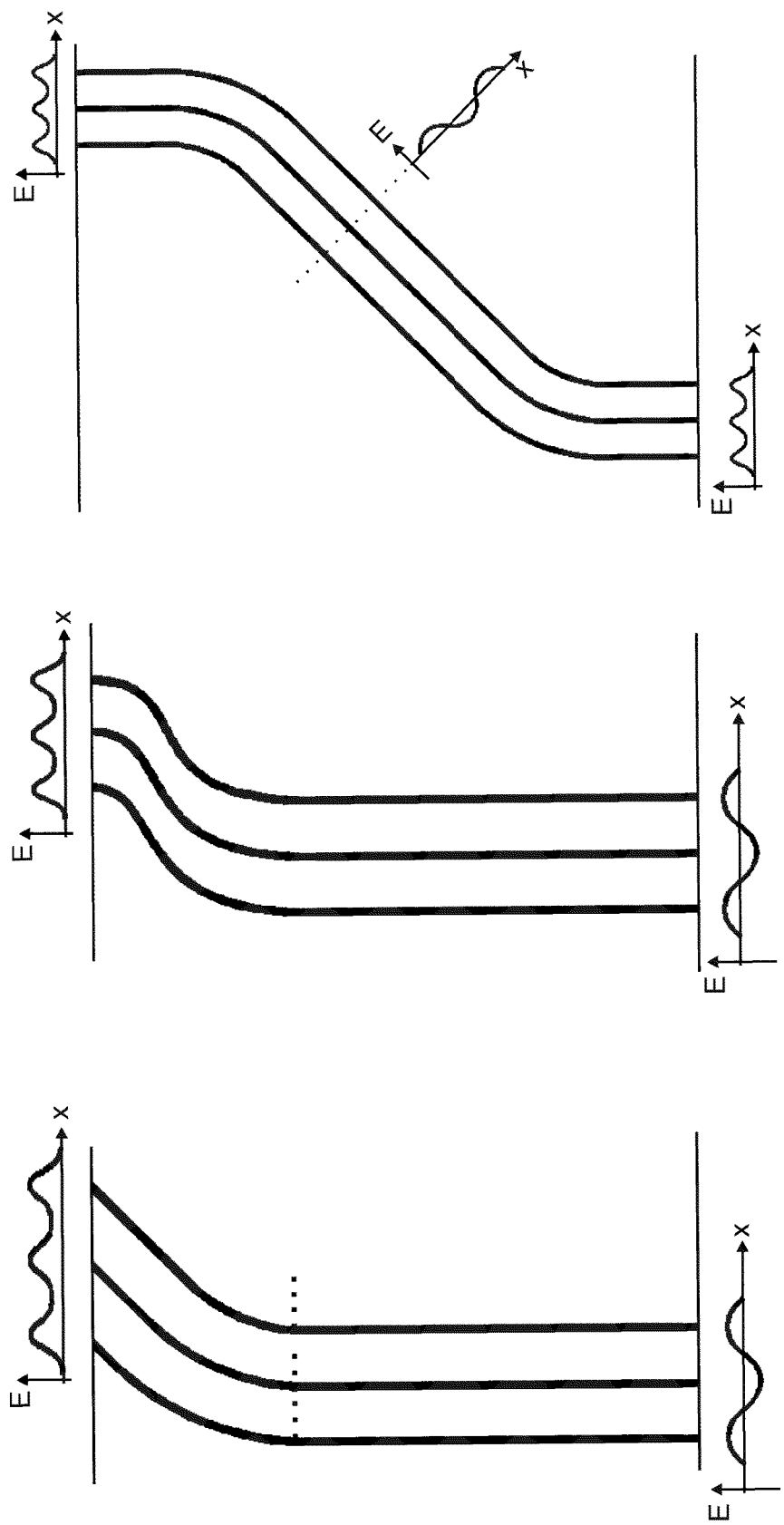
Figure 13:
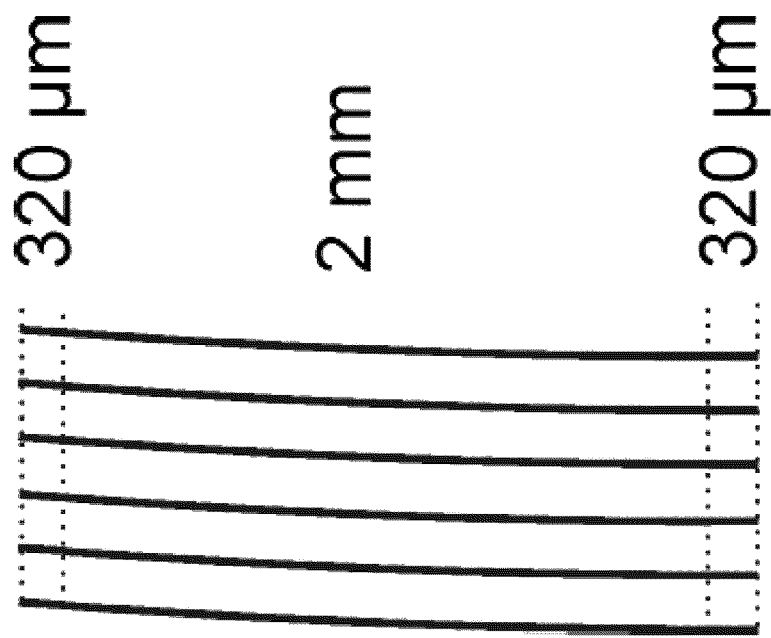
Figure 14:
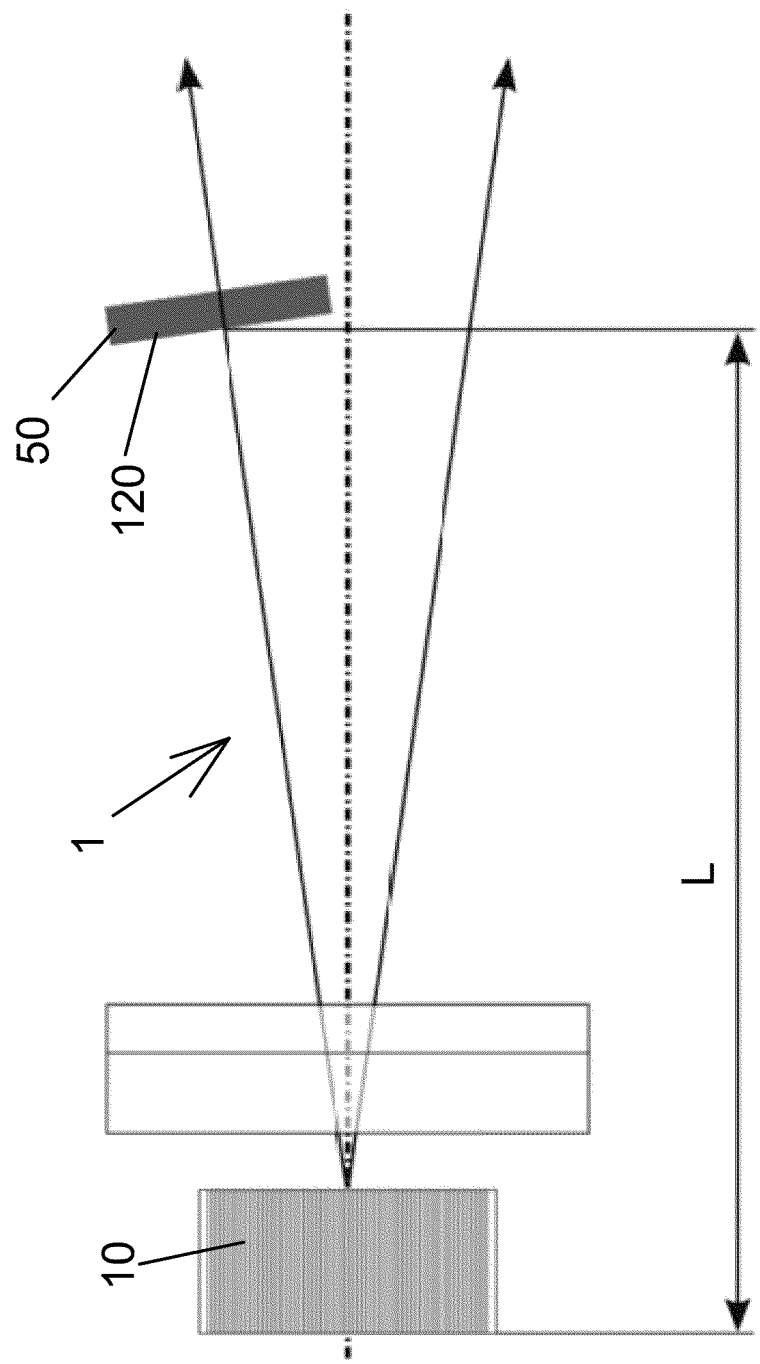
Figure 15:
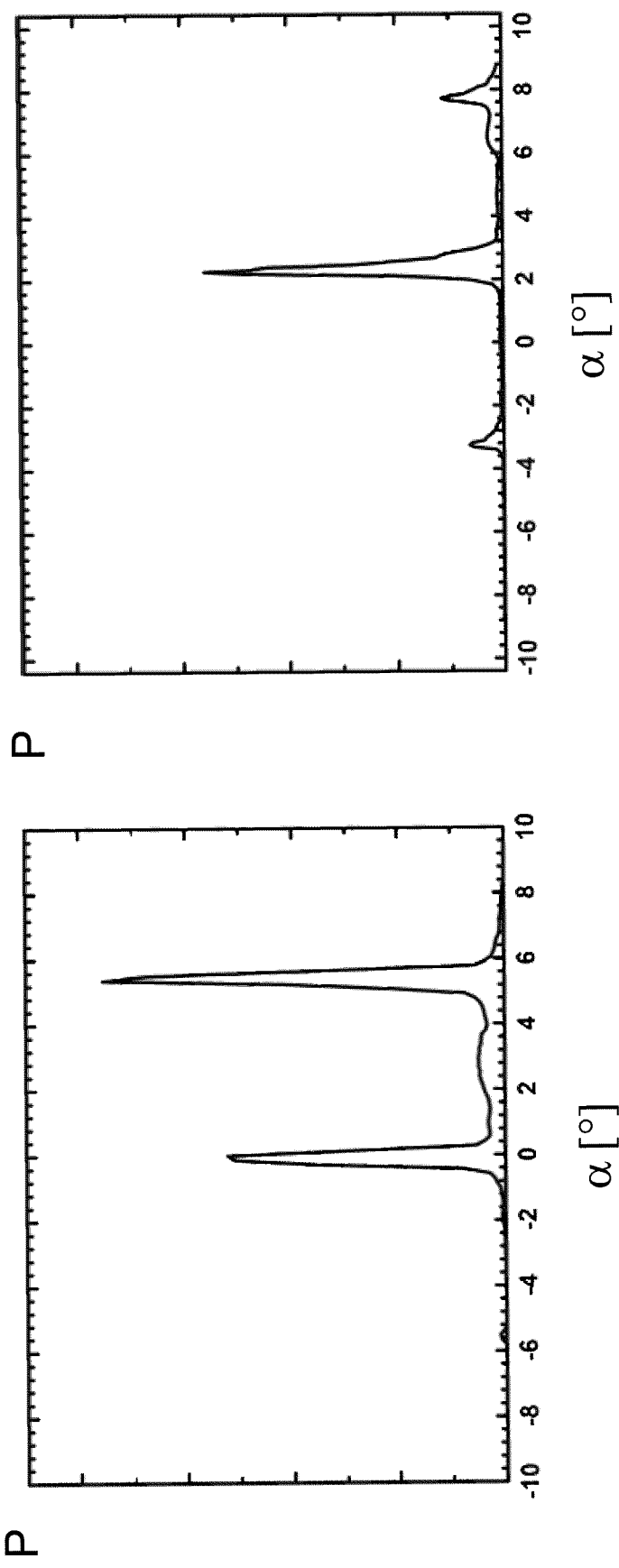
Figure 16:
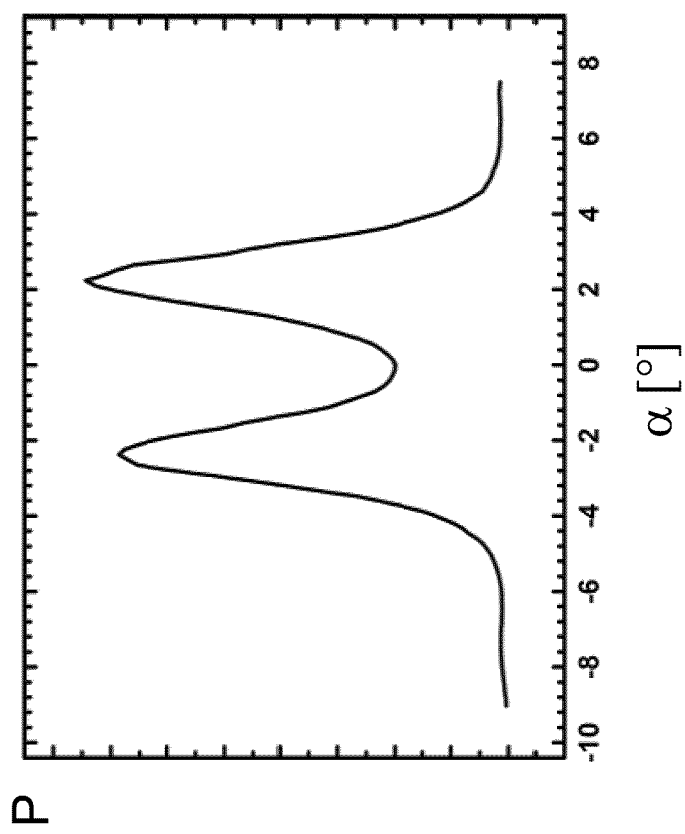
Figure 17:
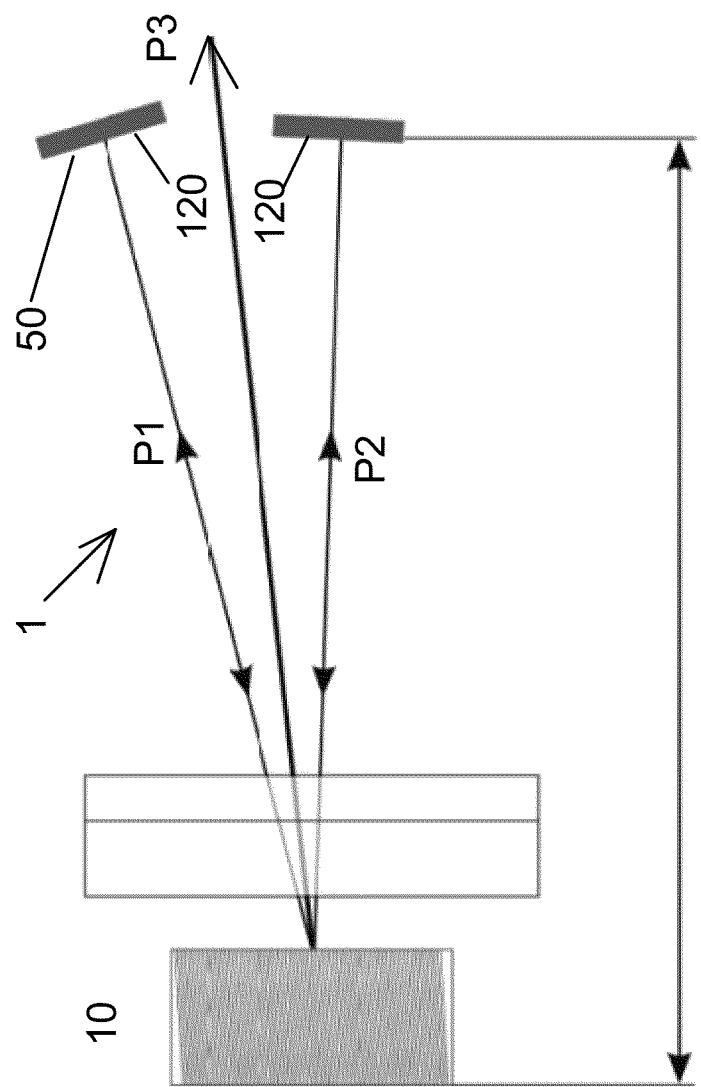

The invention will be explained below in more detail with reference to exemplary embodiments; by way of example, FIG. 1 illustrates a first exemplary embodiment for a laser according to the invention with a laser chip, wherein FIG. 1 illustrates the laser chip in cross section perpendicular to the propagation direction of the active laser channels of the laser chip, FIG. 2 illustrates the laser according to FIG. 1 in a view from above, FIG. 3 shows another exemplary embodiment for a curved profile of the laser channels in the laser according to FIG. 1, FIG. 4 shows another exemplary embodiment for a curved profile of the laser channels in the laser according to FIG. 1, FIG. 5 shows an exemplary embodiment for a laser which is provided with a laser chip and an external resonator, FIG. 6 shows by way of example the profile of the optical output power P over the current I in a laser chip with linear or non-curved laser channels (dashed line) and in a laser with curved laser channels (solid line), FIG. 7 shows by way of example the current-dependent spectra of a laser chip with curved laser channels, wherein the illustration on the left-hand side in FIG. 7 illustrates a laser without external resonator, and the illustration on the right-hand side in FIG. 7 illustrates a laser with external resonator, and wherein in both illustrations in each case the power P over the wavelength λ is shown in nanometres and over the current I in ampere, FIG. 8 shows by way of example the formation of the far field of a mode in coupled laser channels, wherein the solid line in FIG. 8 shows the position of a possible emission beam predetermined by the spacing of the channels, and the dashed line in FIG. 8 shows the intensity of the emission beams determined by the emission of the individual laser channels, FIG. 9 shows by way of example the profile of a plurality of laser channels in a laser chip in the case of a short curvature of the laser channels near the front facet, FIG. 10 shows by way of example a modeling of the lateral far field for two different laser chips, wherein the illustration on the left-hand side in FIG. 10 shows a laser chip with linear laser channels, and the illustration on the right-hand side in FIG. 10 shows a laser chip with curved emitters and wherein in each case the intensity P over the lateral far field angle α is illustrated, FIG. 11 shows by way of example the variation in the phase relationship between neighboring laser channels due to paths of different lengths owing to the curvature of the laser channels, FIG. 12 shows by way of example the variation in the phase relationship between neighboring laser channels such that in the coupling-out facet, or front facet, a phase relationship of 0° between the neighboring laser channels is present, while the phase relationship on a long linear path within the laser chip is π, wherein the illustration on the left-hand side in FIG. 12 shows the emission under an angle which is tilted with respect to the facet normal, the illustration in the center in FIG. 12 shows the emission perpendicular to the front facet by introducing an S-curvature near the front facet, and the illustration on the right-hand side in FIG. 12 shows the emission perpendicular to the front facet by introducing an S-curvature with centered linear path, FIG. 13 shows an exemplary embodiment for a form of the laser channels in which no fixed phase relationship between the individual laser channels owing to internal coupling comes about, FIG. 14 shows an exemplary embodiment for a V resonator, in which, owing to variation of position and angle of a partially transmissive mirror, it is possible to determine under which angle emitted light is coupled back into the laser chip and which mode is preferably excited, FIG. 15 shows an exemplary embodiment for lateral far fields of a laser chip with 419 curved laser channels with a spacing of in each case 6 µm, wherein the respectively oscillating mode is predetermined by an external resonator, wherein in the left-hand illustration of FIG. 15 an oscillating mode is shown and in the right-hand illustration of FIG. 15 the in-phase mode is illustrated and wherein in each case the intensity P over the lateral far field angle α is illustrated, FIG. 16 shows by way of example lateral far fields of a laser chip with 438 linear laser channels, in which the oscillating mode is present without an external resonator, FIG. 17 shows a particularly preferred exemplary embodiment for a laser in which excitation of the in-phase mode with a far field, as shown on the right-hand side in FIG. 15, occurs by the two external secondary beams of the in-phase mode being coupled back and the main beam of the in-phase mode being coupled out, and FIG. 18 shows an exemplary embodiment for the output power/current characteristic curve (P/I characteristic curve) of the main emission beam of a laser chip with 5 mm width and 419 curved laser channels having a spacing of in each case 6 µm (left-hand illustration in FIG. 18) and the associated $M^2$ values (right-hand illustration in FIG. 18).

For reasons of clarity, the same reference signs are used for identical or comparable components throughout the figures.

FIGS. 1 and 2 show a laser 1 with a laser chip 10 in section along the width of the laser chip 10. Shown are a multiplicity of active laser channels 20 which are located next to one another.

The laser chip 10 preferably consists of a semiconductor material which makes possible owing to the design of the active regions an effective electro-optical conversion. This is possible for example with a laser chip 10 made of GaAs, the active regions of which are formed for example from various layers made of AlGaAs, InGaAs or InAlGaAs. The active laser channels 20 can be formed by ridge waveguides which are etched into the chip surface.

The ridges or ridge waveguides can have dimensions in the range of a few µm, and the distance between the ridge waveguides can be a few µm, but possibly also significantly more. FIG. 1 illustrates one example in which the individual active laser channels 20 have identical distances between them. However, it is also possible for different distances between the active laser channels 20 to be realized or for groups of active laser channels 20 having in each case identical distances to also exist. Moreover, the active laser channels can also be produced by other technical structuring of the active semiconductor regions under the surface of the laser chip, wherein the surface of the laser chip in that case is largely flat.

FIG. 2 shows a top view of the laser chip 10 according to FIG. 1. The frontmost edge forms the front facet 10a of the laser chip 10, through which the radiation exits. The rearmost edge forms the rear facet 10b, which is generally made to be highly reflective and from which typically only small amounts of or no radiation exits. The active laser channels 20 at the rear facet 10b are shown to form in each case a right angle with the rear facet 10b. The result is optimum reflection of the radiation and back-coupling into the respective active laser channels.

At the front facet 10a, the active laser channels 20 have an angle with respect to the front facet 10a that deviates from a right angle. Owing to this deviation of the angle, the optical back-coupling of the radiation into the respective active laser channels by reflection at the facet can be reduced significantly. After reflection, the radiation is no longer coupled back into the active laser channels, since the angle of the reflected radiation differs considerably from the angle of the respective active laser channels. The different angles of the active laser channels at the rear facet 10b and the front facet 10a are achieved by a curvature of the active laser channels 20.

FIG. 2 shows one embodiment of the active laser channels 20, in which all the parallel active laser channels have a continuous curvature along the entire length of the laser channels.

FIG. 3 shows another embodiment, in which the active laser channels 20 extend from the rear facet 10b perpendicular and straight at first, and then undergo a curvature only near the front facet 10a. The active laser channels 20 therefore possess both straight and curved channel regions.

FIG. 4 shows one embodiment in which the active laser channels 20 are perpendicular to the rear facet 10b, where a curvature begins. Then, the active laser channels 20 extend in a straight line up to the front facet 10a, where they have an angle which differs from a right angle with respect to the front facet.

The embodiments according to FIGS. 2 to 4 show by way of example a few advantageous designs, in which the active laser channels 20 have identical configuration on the laser chip 10. Alternatively, the active laser channels 20 on the laser chip 10 may also have forms which differ from one another. Furthermore, they do not have to have identical distances and can be arranged in groups.

With small distances between the active laser channels 20, the radiation fields of the individual active laser channels 20 on the laser chip 10 can interact, and, for example, fixed phase relationships between the radiation fields of the individual active laser channels 20 on the laser chip 10 may form. Superordinate radiation modes are the result, which bring about both a reduction in the total number of emitted modes and a reduction in the area (angle range) into which radiation is emitted. However, the laser channels 20 may be arranged far enough from one another so that the coupling of the individual laser channels is achieved only by way of an external resonator.

Owing to the angular position of the active laser channels 20 at the front facet 10a, the back-reflection can furthermore be very effectively suppressed. For this reason, this configuration is particularly suitable for an arrangement in which an external resonator is used for forming the laser 1.

FIG. 5 illustrates by way of example a laser 1 having a laser chip 10 and an external resonator 50. The radiation which exits at the front facet 10a of the laser chip 10 is collimated with a lens 110. A resonator mirror 120 of an external resonator 50 reflects the beam collimated by the lens 110, which beam is coupled back through the lens 110 into the laser chip 10.

By introducing a curvature into the laser channels 20, as was explained above by way of example in connection with FIGS. 2 to 4, it is possible to provide for the laser channels 20 to meet the rear facet 10b at an angle of 90° and the front facet 10a at an angle different from 90°. The reflectivity of the front facet 10a can thus be lowered in a targeted manner while maintaining high reflectivity of the rear facet 10b. This will be explained by way of example with reference to FIG. 6:

FIG. 6 illustrates measured output power (P)/current (I) characteristic curves of two laser chips 10 of 5 mm width having 438 straight and, respectively, 419 curved laser channels 20 with antireflective front facet coating. While the laser chip 10 having the straight laser channels 20 has laser activity (indicated by the linear increase in power as a function of the current) starting from a current of approximately 42 A despite antireflective coating, the laser chip 10 having curved laser channels 20 shows only a minor increase in output power as the current increases, no lasing takes place here.

The left-hand side of FIG. 7 shows spectra of the laser chip with 419 curved stripes as a function of the pump current. The large widths of the spectrum and the low power signify that no laser activity takes place here. In comparison, the right-hand side in FIG. 7 shows current-dependent spectra of the same laser chip using an external resonator. Owing to the back-coupling using the external resonator, lasing occurs here, as a result of which the width of the spectrum is significantly reduced, as is typical for a semiconductor laser.

Owing to the light emission at the front facet, which light emission is tilted with respect to the facet normal (angle differs from 90°), it is additionally possible for the intensity between the emission beams of the carrying supermodes to be redistributed. The intensity distribution of a mode in the far field is determined by the product of the emission of all laser channels (the individual beams of the supermode, the positions of which are given by the channel distance between the laser channels) and the emission of each individual laser channel as would occur without coupling (see FIG. 8).

FIG. 8 illustrates the creation of the far field of a mode in the case of coupled laser channels. The positions of the possible emission beams are given (solid line) by the distance between the laser channels; the intensity of said beams is determined by the emission from the individual laser channels (dashed line).

Owing to a geometry of the laser channels similar to that shown in FIG. 9, the angle of the emission of the individual laser channels can be varied and the intensity in the possible emission beams can thus be changed. FIG. 10 shows modeling results for the lateral far field for two different laser chips:

On the left-hand side in FIG. 10, a laser chip having straight laser channels is shown by way of example. Both main emission beams are of identical strength.

On the right-hand side in FIG. 10, a laser chip with laser channels which are curved near the front facet is shown by way of example; the intensity distribution between the beams is in this case laterally offset corresponding to the emission angle of the laser channels. In the case of the laser chip having curved laser channels, owing to the tilted emission a redistribution of the intensity between the emission beams can thus be observed. This redistribution can be selected by a suitable choice of curvature such that for example the losses in the case of coupling with an external resonator can be minimized or other resonator geometries can be made possible.

In laser chips with a plurality of laser channels, where the individual laser channels are arranged sufficiently closely next to one another, coupling already takes place within the laser chip. With laser channels which are arranged in straight lines having small distances, an oscillating mode occurs in which in each case neighboring laser channels have a phase difference of $\pi$ and an intensity of zero between the individual laser channels. Since the regions between the individual laser channels are not pumped with current and in which therefore absorption occurs, the oscillating mode accordingly has the lowest losses within the laser chip out of all modes. Said mode therefore preferably is present without external resonator and can be supported most easily in the external resonator, which may be a problem where a different mode is intended to be supported.

By introducing a curvature into the laser channels, the phase relationship between neighboring laser channels can be manipulated. Owing to the curvature, the path lengths of the light in the individual laser channels differ, as a result of which the phase relationship between the laser channels changes in dependence on the location. FIG. 11 shows this by way of example for three laser channels. The curvature in this case is chosen such that the path difference of neighboring laser channels is (2n+1) times half the wavelength (n=1, 2, 3, . . . ). This results in a phase difference of $\pi$ in the lower part, and the difference is 0 in the upper part.

This fact can be used for example in order to bring about a phase relationship of $\pi$ with minimal losses inside a laser chip with laser channels which already couple internally in a straight long path, while still bringing about any desired different phase relationship between neighboring laser channels at the coupling-out facet and thus manipulating the form of the far field.

FIG. 12 illustrates this fact by way of example for a phase difference of zero at the coupling-out facet. FIG. 12 shows the change in the phase relationship of neighboring laser channels such that a phase relationship of zero between the neighboring laser channels exists at the coupling-out facet (top), while on a long straight length inside the chip it is $\pi$. FIG. 12 shows on the left-hand side the emission at an angle which is tilted with respect to the facet normal. FIG. 12 shows in the center the emission perpendicular to the front facet through insertion of an S-curvature near the front facet. FIG. 12 shows on the right-hand side the emission perpendicular to the front facet through insertion of an S-curvature with a straight length in the center.

In addition to the above-described use of the curvature for setting the phase difference of neighboring laser channels and the intensity distribution between the different emission beams, it is also possible by way of the curvatures to prevent internal coupling and thus a fixed phase relationship between neighboring laser channels in a targeted manner. This results in no specific mode being preferred by chip-internal coupling and in the selection of the oscillating mode being able to be determined only by the external resonator. This can be achieved for example by a form of the laser channels (as illustrated in FIG. 13). In this case, the central portion of the laser channels is slightly curved over a long length of 2 mm, as a result of which the phase relationship between neighboring laser channels continuously shifts and as a result no fixed phase relationship between the laser channels brought about by internal coupling can form.

In experiments carried out by the inventors using laser chips 10 with a width of 5 mm and 419 curved laser channels having a distance of in each case 6 µm, it could be observed that in a V resonator 50 (cf. FIG. 14), both the oscillating mode with two emission beams and the in-phase mode having one main beam and two lateral beams can be excited without difficulty, depending on the mirror position of the resonator mirror 120 of the resonator 50. Since no mode is preferred by internal coupling, the relative phase position of the individual laser channels could be impressed successfully from the outside. The length L of the laser 1 is for example 800 mm.

FIG. 15 illustrates the measured lateral far fields of the laser chip 10 in the external resonator 50 for the arrangement according to FIG. 14 for the exemplary case of a laser chip having 419 curved laser channels having a distance of in each case 6 µm. The respectively oscillating mode was predetermined by the external resonator 50. The illustration on the left-hand side illustrates the oscillating mode, and the illustration on the right-hand side illustrates the in-phase mode. Owing to the curvature of the laser channels, the far fields are additionally laterally offset.

Comparable measurements using a laser chip with a width of 5 mm and 438 straight laser channels having a distance of in each case 6 µm show that without an external resonator, it is preferably the oscillating mode which is present. FIG. 16 shows by way of example the lateral far field of the oscillating mode during operation without external resonator. Shown are the lateral far fields of a laser chip with 438 straight laser channels.

The possibility of being able to excite different modes than the oscillating mode in a stable manner even with small distances between laser channels in the laser chip provides new possibilities for designing the external resonator. In the oscillating mode, at least two emission beams always exist, which must be recombined for use outside the resonator. In the case of excitation of the in-phase mode (as shown on the right-hand side in FIG. 15), however, the two secondary beams can be used for external coupling, as a result of which it is possible for only a single emission beam to be formed behind the resonator. Such a construction is illustrated by way of example in FIG. 17.

FIG. 17 illustrates a further exemplary embodiment for a laser 1 having a laser chip 10 and an external resonator 50. In this laser 1, the excitation of the in-phase mode takes place with a far field, as is shown in FIG. 15 on the right. The two outer secondary beams P1 and P2 are coupled back using two resonator mirrors 120 of the resonator 50 which are arranged symmetrically about the main beam P3, and the main beam P3 is coupled out.

In the case of the laser 1 according to FIG. 17, the in-phase mode of a laser chip with a width of 5 mm and 419 curved laser channels having a distance of in each case 6 μm could be excited using the resonator 50 and an output power of the main emission beam of 18 W could be achieved (cf. FIG. 18, left-hand side). The beam quality was excellent up to high currents of 85 A with an $M^2$ value of less than 7 (cf. FIG. 18, right-hand side).

In comparison: the $M^2$ value of a laser chip with a width of 5 mm and 438 straight laser channels having a distance of in each case 6 μm without external resonator showed a high $M^2$ value of 45.

The dimensionless diffraction number $M^2$ is a measure of the beam quality of a (laser) beam, which depends on the beam diameter $d_0$, the beam divergence $\Theta$ and the wavelength $\lambda$ according to $$M^2 = d_0 \Theta \pi / 4\lambda.$$

Diffraction-limited ideal Gaussian beams show a minimum $M^2$ of 1, while real laser beams have $M^2$ values of greater than 1. The larger $M^2$ is, the worse the focusing of the beam, that is to say the larger the smallest focus diameter that is possible.

LIST OF REFERENCE SIGNS

1 laser
10 laser chip
10*a* front facet
10*b* rear facet
20 laser channel
50 resonator
110 lens
120 resonator mirror
I current
L length
P output power/intensity
P1 secondary beam
P2 secondary beam
P3 main beam
α far field angle
λ wavelength

The invention claimed is:

1. A laser comprising:
a laser chip having a plurality of active laser channels, a front facet for coupling out the laser radiation of the laser channels and a rear facet for rear-side reflection of the laser radiation of the laser channels in the direction of the front facet;
an external resonator which couples a portion of the radiation exiting the laser chip at the front facet back into the laser chip and, by said back-coupling, couples the radiation of the laser channels with one another;
wherein at least one of the laser channels is curved at least sectionally and—in the far field—in addition to a main beam, at least one secondary beam is divergently emitted by the laser chip;
wherein the resonator reflects at least one of the secondary beams, which is—in the far field—divergently emitted by the laser chip next to the main beam, in the direction of the laser chip; and
wherein
the curvature of the laser channels is configured such that, without the back-coupling of the resonator, no fixed phase relationship between neighboring laser channels occurs and no mode is preferred owing to chip-internal coupling of the laser channels, and
the mode present in the laser chip is determined by the back-coupling of the resonator.

2. A laser comprising:
a laser chip having a plurality of active laser channels, a front facet for coupling out the laser radiation of the laser channels and a rear facet for rear-side reflection of the laser radiation of the laser channels in the direction of the front facet;
an external resonator which couples a portion of the radiation exiting the laser chip at the front facet back into the laser chip and, by said back-coupling, couples the radiation of the laser channels with one another;
wherein at least one of the laser channels is curved at least sectionally and—in the far field—in addition to a main beam, at least one secondary beam is divergently emitted by the laser chip;
wherein the resonator reflects at least one of the secondary beams, which is—in the far field—divergently emitted by the laser chip next to the main beam, in the direction of the laser chip; and
wherein owing to the curvature of the laser channel or channels and the coupling of the laser channels by the resonator, an in-phase mode is formed with—in the far field—a main beam and two secondary beams, divergently emitted next to the main beam.

3. A laser comprising:
a laser chip having a plurality of active laser channels, a front facet for coupling out the laser radiation of the laser channels and a rear facet for rear-side reflection of the laser radiation of the laser channels in the direction of the front facet;
an external resonator which couples a portion of the radiation exiting the laser chip at the front facet back into the laser chip and, by said back-coupling, couples the radiation of the laser channels with one another;
wherein at least one of the laser channels is curved at least sectionally and—in the far field—in addition to a main beam, at least one secondary beam is divergently emitted by the laser chip;

wherein the resonator reflects at least one of the secondary beams, which is—in the far field—divergently emitted by the laser chip next to the main beam, in the direction of the laser chip; and wherein the resonator (50) is configured such that it optically couples the radiation of the laser channels such that an in-phase mode is present in the laser chip which has—in the far field—the main beam and the divergently emitted secondary beams.

4. A laser comprising:

a laser chip having a plurality of active laser channels, a front facet for coupling out the laser radiation of the laser channels and a rear facet for rear-side reflection of the laser radiation of the laser channels in the direction of the front facet;

an external resonator which couples a portion of the radiation exiting the laser chip at the front facet back into the laser chip and, by said back-coupling, couples the radiation of the laser channels with one another;

wherein at least one of the laser channels is curved at least sectionally and—in the far field—in addition to the main beam, at least one secondary beam is divergently emitted by the laser chip;

wherein the resonator reflects at least one of the secondary beams, which is—in the far field—divergently emitted by the laser chip next to the main beam, in the direction of the laser chip; and wherein the laser channels have curvatures which deviate from one another.

5. A laser comprising:

a laser chip having a plurality of active laser channels, a front facet for coupling out the laser radiation of the laser channels and a rear facet for rear-side reflection of the laser radiation of the laser channels in the direction of the front facet;

an external resonator which couples a portion of the radiation exiting the laser chip at the front facet back into the laser chip and, by said back-coupling, couples the radiation of the laser channels with one another;

wherein at least one of the laser channels is curved at least sectionally and—in the far field—in addition to a main beam, at least one secondary beam is divergently emitted by the laser chip;

wherein the resonator reflects at least one of the secondary beams, which is—in the far field—divergently emitted by the laser chip next to the main beam, in the direction of the laser chip; and wherein, owing to the curvature of the laser channel or channels and owing to the back -coupling of the resonator, the coupling of the laser channels is set such that the phase position of the radiation of the individual laser channels exiting at the front facet among one another is less than 45°.

6. A laser comprising:

a laser chip having a plurality of active laser channels, a front facet for coupling out the laser radiation of the laser channels and a rear facet for rear-side reflection of the laser radiation of the laser channels in the direction of the front facet;

an external resonator which couples a portion of the radiation exiting the laser chip at the front facet back into the laser chip and, by said back-coupling, couples the radiation of the laser channels with one another;

wherein at least one of the laser channels is curved at least sectionally and-in the far field-in addition to a main beam, at least one secondary beam is divergently emitted by the laser chip;

wherein the resonator reflects at least one of the secondary beams, which is—in the far field—divergently emitted by the laser chip next to the main beam, in the direction of the laser chip; and wherein, owing to a chip-internal coupling of the laser channels in the laser chip, at least also an in-phase mode is present, which has—in the far field—the main beam and the divergently emitted secondary beams, and the mode present in the laser chip is supported by the external resonator.

7. A laser comprising:

a laser chip having a plurality of active laser channels, a front facet for coupling out the laser radiation of the laser channels and a rear facet for rear-side reflection of the laser radiation of the laser channels in the direction of the front facet;

an external resonator which couples a portion of the radiation exiting the laser chip at the front facet back into the laser chip and, by said back-coupling, couples the radiation of the laser channels with one another;

wherein at least one of the laser channels is curved at least sectionally and—in the far field—in addition to a main beam, at least one secondary beam is divergently emitted by the laser chip;

wherein the resonator reflects at least one of the secondary beams, which is—in the far field—divergently emitted by the laser chip next to the main beam, in the direction of the laser chip; and wherein owing to the curvature of the laser channel or channels and the coupling of the laser channels by the resonator, an in-phase mode is formed with—in the far field—a main beam and two secondary beams, divergently emitted next to the main beam, and wherein the main beam is coupled out of the laser.

8. A laser comprising:

a laser chip having a plurality of active laser channels, a front facet for coupling out the laser radiation of the laser channels and a rear facet for rear-side reflection of the laser radiation of the laser channels in the direction of the front facet;

an external resonator which couples a portion of the radiation exiting the laser chip at the front facet back into the laser chip and, by said back-coupling, couples the radiation of the laser channels with one another;

wherein at least one of the laser channels is curved at least sectionally and—in the far field—in addition to a main beam, at least one secondary beam is divergently emitted by the laser chip;

wherein the resonator reflects at least one of the secondary beams, which is—in the far field—divergently emitted by the laser chip next to the main beam, in the direction of the laser chip; and wherein the resonator is configured such that it optically couples the radiation of the laser channels such that an in-phase mode is present in the laser chip which has—in the far field-the main beam and the divergently emitted secondary beams, and wherein the main beam is coupled out of the laser.

* * * * *